United States Patent [19]

Johnson

[11] Patent Number: 5,246,538

[45] Date of Patent: Sep. 21, 1993

[54] ADHESIVE BONDING OF POLY(ARYLENE SULFIDE) SURFACES

[75] Inventor: Timothy W. Johnson, Bartlesville, Okla.

[73] Assignee: Phillips Petroleum Company, Bartlesville, Okla.

[21] Appl. No.: 760,305

[22] Filed: Sep. 16, 1991

[51] Int. Cl.$^5$ ............................................. H01L 21/00
[52] U.S. Cl. ..................................... 156/656; 156/632; 156/634; 156/666; 156/155; 156/281
[58] Field of Search ............... 156/632, 634, 643, 656, 156/666, 155, 281

[56] References Cited

U.S. PATENT DOCUMENTS

| | | | |
|---|---|---|---|
| 4,011,121 | 3/1977 | Doss | 156/82 |
| 4,354,895 | 10/1982 | Ellis | 156/632 |
| 4,370,469 | 1/1983 | Deguchi et al. | 528/388 |
| 4,389,453 | 6/1983 | Kitauaka et al. | 428/240 |
| 4,411,952 | 10/1983 | Sasaki et al. | 428/332 |
| 4,526,806 | 7/1985 | Haque et al. | 427/41 |
| 4,615,907 | 10/1986 | Boell et al. | 427/53.1 |
| 4,647,345 | 3/1987 | Polan | 204/13 |
| 4,876,325 | 10/1989 | Olson et al. | 528/170 |
| 4,964,945 | 10/1990 | Calhoun | 156/634 |

FOREIGN PATENT DOCUMENTS 2065348  5/1973  Fed. Rep. of Germany.

*Primary Examiner*—Brian E. Hearn
*Assistant Examiner*—George Goudreau
*Attorney, Agent, or Firm*—George E. Bogatie

[57] ABSTRACT

Preparing an arylene sulfide polymer surface for improved bonding to another surface includes molding the initially smooth polymer surface to fit the contours of a metallic foil having a high topographical surface configuration so as to form a laminate; etching away the metallic foil from the laminate, and thereby imparting the desired high topographical configuration of the metallic foil onto the polymer surface, so as to improve adhesive bonding characteristics of the polymer surface.

11 Claims, No Drawings

ADHESIVE BONDING OF POLY(ARYLENE SULFIDE) SURFACES

This invention relates to arylene sulfide polymer surfaces exhibiting strong adhesive bonding. In one aspect, it relates to forming a surface configuration on poly(arylene sulfide) for improving bonding characteristics of the poly(arylene sulfide) surface. In another aspect, it relates to improving adhesive bondability of a solid poly(arylene sulfide) surface to a like surface or to the surface of another material.

BACKGROUND OF THE INVENTION

Poly(arylene sulfides), hereinafter referred to as "PAS" for brevity, refers to a family of engineering thermoplastic resin, which due to their stability at high temperature, superb mechanical properties and resistance to various chemicals, have found ever widening areas of application. Bonding together of two PAS surfaces, however, is desirable in many possible applications, such as packaging commercial products between overlays of PAS material, adhering together thermoplastic parts formed in separately molded sections to make a complete article, etc. Improved bonding of PAS surfaces to surfaces of other materials is also desirable in many applications. While PAS processing techniques known in the art provide a material which is highly suited for many other applications, it has been found that lack of satisfactory adhesion between two PAS surfaces or surfaces of PAS and other material, has limited the use of this thermoplastic material in some applications which could otherwise benefit from its many outstanding characteristics.

Good adhesive bonding between solid surfaces is generally obtained if the surfaces to be bonded have a relatively high topographical configuration. Accordingly, a method of providing a high topographical configuration on a surface of a PAS material would be highly desirable.

It is a primary object of this invention to provide a new method for adhesive bonding of PAS surfaces wherein improved adhesion is achieved in a safe, simple, economic and expedient manner.

It is a more specific object of this invention to provide a component made of PAS having a surface area of high topography which improves adhesive bonding.

SUMMARY OF THE INVENTION

In accordance with this invention, I have discovered that a high topographical configuration can be formed on an initially smooth surface of PAS polymeric material to provide a surface of PAS polymeric material having improved bondability. The high topographical configuration is achieved by first overlaying a metallic foil, already having a suitably high topographical configuration imprinted thereon, onto the surface of the PAS material to be bonded, then molding the surface of PAS material to fit the contours of the high topographical foil, thereby leaving the desired high topographical configuration of the metallic foil impressed in the PAS surface when the metallic foil is removed.

In a preferred embodiment of this invention, a heat pressing or injection molding operation is employed to form a laminate of PAS material and copper foil, followed by etching away of the metallic foil. The PAS material for forming the PAS-copper laminate is selected from the group including unfilled PAS and fiber glass filled PAS, and when the copper foil is etched away from the PAS surface, the resulting PAS surface having a high topographical configuration can be adhesively bonded with improved bond strength to another surface comprising a sheet-like PAS surface which is similarly prepared, or to a surface of another material. A lap bond between two PAS surfaces having the high topographical configuration results in a bond with unexpectedly high lap shear strength.

Other objects and advantages of the present invention will be apparent from the following description.

DETAILED DESCRIPTION OF THE PREFERRED EMBODIMENT

It is general practice in producing a printed circuit board to apply a metallic foil, such as a copper foil onto a PAS sheet-like material through employment of a suitable adhesive, or to form a metallic layer on the surface of the PAS sheet by plating or vacuum metalizing, etc. Alternatively, a laminated sheet of PAS and metallic foil can be produced either by applying PAS onto the metallic foil by extrusion laminating or by fusing together the PAS and the metallic foil by heat pressing. The metallic foil is then pattern-etched to form the desired conductive paths for the printed circuit board. The above mentioned techniques for firmly adhering a copper foil to an insulating substrate are highly useful in producing printed circuit boards for use in the electronics industry.

In the present invention, however, it is critical to recognize that the surface of PAS material, which is laminated by heated compression-molding against a metallic foil in a mold heated to a temperature higher than the melting point of the PAS material, ordinarily 290° to 330° C., will retain the topographical configuration of the metallic foil after the laminate is cooled and the foil is etched away. Alternately, the molding process for laminating the plastic resin against the high topographical foil can be carried out in an injection molding operation. In injection molding, the polymer is melted in an extruder and then rapidly injected into a mold cavity having the shape of the desired object. The mold is maintained at a temperature at which the PAS solidifies rapidly, generally on the order of 10-20 seconds, which is generally less than the cycle time for heated compression molding. If one side of the piece to be injection molded is essentially flat, a high topographical foil can be placed over that flat surface of the mold with the rough side of the foil towards the mold cavity. When the polymer melt is injected into the cavity, rapidly and under high pressure, it will fill the contours of the foil and impart the high topographical configuration of the foil onto the PAS surface when the metallic foil is removed.

The etching process contemplated in this invention for removing the copper foil from the PAS material is well established in the industry and is essentially the same process used in the manufacture of the great majority of the printed circuit boards used in the electronics industry. Many known chemical etching systems and equipment are suitable for use in the present invention. An example of a suitable etchant solution is aqueous nitric acid.

As used herein, a surface having a high topographical configuration comprises a surface having adjoining minute projections and is analogous to a continual mountainous area with each mountain about 2 microns high and 3 microns diameter at its base. A copper foil designated JTC, which has a surface configuration of high topography suitable for use in this invention, is commercially available from Gould, Inc., Foil Division, Eastlake, Ohio 44094.

For the purposes of this disclosure and the appended claims, the term PAS is intended to designate arylene sulfide polymers. Uncured or partially cured PAS polymers, whether homopolymer, copolymer, terpolymer, and the like, or a blend of such polymers, can be used in the practice of the present invention. The uncured or partially cured polymer is a polymer the molecular weight of which can be increased by either lengthening of a molecular chain or by cross-linking or by combination of both by supplying thereto sufficient energy, such as heat (optionally in the presence of oxygen).

Preferred PAS polymer of the present invention can be represented by repeating units of the structural formula:

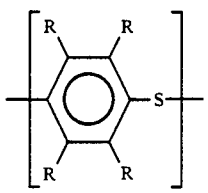

wherein R is selected from the group consisting of hydrogen and alkyl radicals having 1 to 4 carbon atoms.

PAS of the present invention can be branched by the addition of a branching agent, such as a trihalobenzene. Branching agents can be represented by the formula:

$ArX_n$ wherein X is a halogen, $n \geq 3$ and Ar is an aromatic nucleus.

Some examples of poly(arylene sulfide) suitable for the purposes of the present invention include poly(2,4-tolylene sulfide), poly(4,4'-biphenylene sulfide), and poly(phenylene sulfide) (PPS). Because of its availability and desirable properties (such as high chemical resistance, nonflammability, high strength and hardness) poly(phenylene sulfide) is the presently preferred poly(arylene sulfide).

In a preferred embodiment of the present invention, a high molecular weight, linear PAS, produced in a reaction mixture from polymerization which includes linear PAS, sodium chloride, water and N-methyl-2-pyrrolidone (NMP), is employed as the polymeric material. The reaction mixture can be made in accordance with the teachings of U.S. Pat. No. 3,919,177 to Campbell which is incorporated herein by reference. According to the process described therein, p-dichlorobenzene is reacted with sodium sulfide in N-methylpyrrolidone in the presence of an alkali metal carboxylate. Various poly(arylene sulfide) resins are commercially available under the trademark Ryton ® from Phillips Petroleum Company, Bartlesville, Okla.

Although this invention is not limited thereto, the PAS material can also contain other ingredients, such as reinforcing agents and fillers.

The reinforcing agent can be, for example, glass. Fiber glass is preferred because in this form (i.e. high ratio of length to diameter) the reinforcement utility of the glass is optimized. Other forms of glass, such as, for example, powder, grain and beads are, nonetheless, within the scope of this invention. Examples of other suitable reinforcing agents include, by way of nonlimiting example, asbestos fibers and ceramic fibers.

Fillers can be used to improve the dimensional stability, thermal conductivity and mechanical strength of the PAS polymer. Suitable fillers include, for example, talc, silica, clay, alumina, calcium sulfate, calcium carbonate, mica and so on. The fillers can be in the form of, for example, powder, grain or fiber.

Besides reinforcing agents and fillers, the PAS polymer employed in this invention can optionally contain relatively small amounts of other ingredients such as, for example, pigments and processing aids.

The presently preferred PAS for use in this invention is poly(phenylene sulfide) reinforced with short glass fibers. This resin is commercially available under the trademark Ryton ® R-4 PPS from Phillips Petroleum Company, Bartlesville, Okla. 74005. Another suitable glass reinforced, mineral filled resin is Ryton ® R-7.

The preferred PAS surfaces contemplated in this invention are generally planar surfaces which can be on solid objects molded from PAS, objects coated with PAS, or laminates of PAS with solid materials, such as fiberglass, fabric, cloth, etc., or injection molded articles made from PAS which is either unfilled or filled with chopped fiberglass, as well as on any other suitable type of material possessing a cured or uncured PAS surface. The presently preferred polymer is poly(phenylene sulfide) resin either unfilled or filled with about 5 to about 60 weight percent of chopped glass fibers.

In the present context, cured PAS resin, or a coating made from this resin, is one which has been heat-treated for a time and at a temperature which are sufficient to increase the melt viscosity of the resin or the toughness of the coating. The typical cure procedure is heat-treating the resin for 1 hour at 260° C. (500° F.).

The solid surface to which the high topographical PAS surface is adhesively bonded can be any solid surface. This solid surface can, for instance consist of a metal, such as steel, aluminum or copper; a plastic material, such as polyethylene, polypropylene, polyvinyl chloride, acrylonitrile-butadiene-styrene resin, polystyrene, etc. The surface can also consist of wood, ceramic material, glass or concrete. It may be desirable to also pretreat the solid surface to be bonded to the PAS surface in order to further improve adhesion. Examples of such treatment include mechanical roughening, heat-treatment, solvent-treatment, a treatment with a primer, etc.

For the purposes of this invention, any adhesive which provides the desired bond strength between the PAS surface and a second surface can be used. Examples of useful types of adhesives which are commercially available include epoxy-based, cyanoacrylate based, polysulfone based, rubber based, polyamide based and silicone based adhesives. These adhesives can be applied to the poly(arylene sulfide) surface or to the second surface as a blend, a mixture, a solution, an emulsion or as hot melt. The thickness of the adhesive film is determined in accordance with the desired bond strength. The presently preferred adhesives are those on the bases of epoxy and cyanoacrylate. These adhesives confer particularly high bond strength to the adhesive bonds between the PAS surface and the second surface.

The treated PAS surface and the second surface to be bonded thereto are sandwiched with the selected adhesive between them and are contacted and kept in the contacted condition for a time and under temperature and pressure conditions to effect the desired bonding. The temperature employed depends upon the type of adhesive and will be generally below the decomposition temperature, melting or softening point, etc., of the poly(arylene sulfide) and the second surface. These bonding temperatures fall in the range of about 0° to about 375° C. and preferably are in the range of about 25° to about 200° C.

To bond the two surfaces together, pressure can be applied. Pressure from up to about 10,000 psig can be used. It is, however, generally preferred to employ pressure near atmospheric pressure, i.e., of up to about 20 psig.

The time to fix the bonding depends upon the type of adhesive and the temperature employed. These bonding times usually are in the range of about 1 minute to 48 hours. Times in the range of 5 minutes to 24 hours are preferred.

This invention will be more fully understood from the following examples illustrating preferred embodiments of the invention. The examples, however, are not intended to limit the scope of this invention.

EXAMPLES

Example I

Into a 6"×6"×0.062" i.d. picture frame compression mold was placed a stack of materials comprising a 6" square of Gould JTC copper foil as one outer surface, a 6" square of Metallverken 110 type plain copper foil as the other outer surface, a 6" square of 3 mil thick PPS film as each of the two next innermost layers, a 6" square of woven glass fabric as each of the two next innermost layers and a core of sufficient PPS pellets to permeate the glass fabric and form an essentially void free, approximately 0.062" thick laminate upon molding. The mold and its contents (between caul plates) were placed into a hydraulic, heated platen press at 320° C. Contact pressure was applied for 4 minutes followed by 3 minutes at 15,000 lb. As quickly as possible, the pressure was released and the mold, laminate and caul plates were transferred to a similar press with water cooled platens. After cooling, the assembly was removed from the press and the laminate was removed from the mold. The laminate was then annealed at 150° C. for 30 minutes. It was then cut into two 3"×6" pieces, each of which was cut further to produce 6"×½" strips.

The Metallverken foil was peeled from each strip. The strips were then immersed in a solution of 50 grams of ferric chloride hexahydrate dissolved in 40 ml of water to etch away the remaining copper foil. The ferric chloride solution was maintained at an elevated temperature by immersion in hot tap water. After about 40 minutes, the strips were removed, rinsed thoroughly with water, rinsed in 1.0 wt. % aqueous oxalic acid, rinsed again with water, blotted lightly with paper towels to remove excess water, and dried in air overnight.

The strips were then bonded together in pairs in a lap shear configuration (1" overlap) using a Devcon epoxy adhesive. Three pairs were bonded in which mating surfaces were the relatively smooth surfaces from the Metallverken foil side of the laminate and three pairs were bonded in which mating surfaces were the high topographical surfaces from the Gould JTC foil side of the laminate. For simplicity, the former will hereinafter be referenced as "smooth side" while the latter will be referenced as "treated side".

The above lap sheer specimens were then tested using the general procedures outlined in ASTM method D 3163. The results of the above tests are given in Table I, below.

TABLE I

| Lap Shear Test Results | |
|---|---|
| Sample | Stress at Break, psi |
| "Smooth side" | 287* |
| "Treated side" | 1010* |

*Average of three determinations.

The results presented in Table I, above, show that the bond strength between the "treated side" samples is more than three times as great as that between the "smooth side" samples.

Example II

The procedures outlined in Example I, above, were repeated with the following exceptions: In addition to removing the Gould JTC foil from some specimens with aqueous ferric chloride, the Gould foil was removed from other specimens by immersing them for about 15 minutes in a 25% aqueous nitric acid solution. In all cases in this Example, the rinsing with aqueous oxalic acid was omitted. Some specimens were bonded using a 1" overlap, as in Example I, while others were bonded using a 0.5" overlap. For all specimens in this Example, it was the "treated sides" that were bonded together. Test results are given in Table II, below.

TABLE II

| Additional Lap Test Results | | |
|---|---|---|
| Foil Removal Method | Overlap (inches) | Stress at Break (psi) |
| FeCl₃ | 1.0 | 1070* |
| FeCl₃ | 0.5 | 1470** |
| HNO₃ | 0.5 | 1670** |

*Single determination.
**Average of three determinations.

The results in Table II, above, show (by comparison with the results shown in Table I) that the oxalic acid rinse used in Example I is not required and that removal of the Gould JTC foil with aqueous nitric acid may be preferred to removal with aqueous ferric chloride.

This invention is particularly applicable to improving bondability of the PAS plastic surfaces and is illustrated in the examples in terms of PPS. Reasonable variations and modifications, such as imparting a high topographical configuration to surfaces of any number of plastic resin, including thermoplastic and thermoset materials, by the sequence of molding the plastic material to fit the contours of a metallic foil followed by etching, are possible by those skilled in the art and are within the scope of the disclosure and the appended claims. Among the considered suitable plastics are thermoplastics including: polyethylene, polypropylene, poly-4-methylpentene, polysulfone, polyethersulfone, polyetherimide, thermoplastic polymide, polyether ketone, etc. and thermoset plastics including: epoxy, silicone, bismaleimides, etc.

That which is claimed is:

1. A method for obtaining improved adhesive bondability for a poly(arylene sulfide) surface, said method comprising the following steps:
   (a) overlaying a metallic foil having a high topographical configuration imprinted thereon onto said poly(arylene sulfide) surface;

(b) molding said poly(arylene sulfide) surface to fit the contours of said metallic foil; and (c) etching said metallic foil away from said poly(arylene sulfide) surface, wherein the high topographical configuration of said metallic foil is imparted onto said poly(arylene sulfide) surface.

2. A method in accordance with claim 1 wherein said poly(arylene sulfide) is poly(phenylene sulfide).

3. A method in accordance with claim 2 wherein said metallic foil is a copper foil.

4. A method in accordance with claim 1 wherein molding of said poly(arylene sulfide) surface to fit the contours of said metallic foil is carried out in a temperature range from about 290° C. to about 330° C. in a compression molding operation.

5. A method in accordance with claim 1 wherein molding of said poly(arylene sulfide) surface to fit the contours of said metallic foil is carried out in an injection molding operation.

6. A method in accordance with claim 1, wherein said etching step (c) is carried out in a solution of aqueous nitric acid.

7. A method for bonding a first surface comprising a poly(arylene sulfide) surface to a second surface, said method comprising:

(a) overlaying a metallic foil having a high topographical configuration imprinted therein onto said first surface;

(b) molding said first surface to fit the contours of said metallic foil;

(c) etching said metallic foil away from said first surface, wherein the high topographical configuration of said metallic foil is imparted onto said first surface; and (d) adhesively bonding said first surface to said second surface.

8. A method in accordance with claim 7, wherein said step of adhesively bonding provides a lap shear configuration bond with about 0.5 inch overlap, and wherein a lap shear stress associated therewith is about 1670 psi at break as measured in accordance with ASTM test method D 3163.

9. A method in accordance with claim 7 wherein said poly(arylene sulfide) is poly(phenylene sulfide) and said metallic foil is a copper foil.

10. A method in accordance with claim 7 wherein said second surface comprises a poly(arylene sulfide) surface.

11. A method in accordance with claim 7 wherein said second surface is selected from the group including plastic, metal, wood, ceramic, glass and concrete material.

* * * * *